United States Patent
Liou et al.

(10) Patent No.: US 9,583,568 B2
(45) Date of Patent: Feb. 28, 2017

(54) SEMICONDUCTOR STRUCTURE AND MANUFACTURING METHOD THEREOF

(71) Applicant: UNITED MICROELECTRONICS CORP., Hsin-Chu (TW)

(72) Inventors: En-Chiuan Liou, Tainan (TW); Ssu-I Fu, Kaohsiung (TW); Chia-Lin Lu, Taoyuan (TW); Shih-Hung Tsai, Tainan (TW); Chih-Wei Yang, Kaohsiung (TW); Chia-Ching Lin, Kaohsiung (TW); Chia-Hsun Tseng, Tainan (TW); Rai-Min Huang, Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 46 days.

(21) Appl. No.: 14/612,300

(22) Filed: Feb. 3, 2015

(65) Prior Publication Data
US 2016/0204197 A1    Jul. 14, 2016

(30) Foreign Application Priority Data
Jan. 8, 2015  (CN) .......................... 2015 1 0008807

(51) Int. Cl.
| | |
|---|---|
| H01L 29/66 | (2006.01) |
| H01L 21/84 | (2006.01) |
| H01L 27/06 | (2006.01) |
| H01L 29/78 | (2006.01) |
| H01L 29/06 | (2006.01) |
| H01L 21/762 | (2006.01) |
| H01L 27/12 | (2006.01) |
| H01L 21/76 | (2006.01) |

(52) U.S. Cl.
CPC ...... *H01L 29/0684* (2013.01); *H01L 21/76232* (2013.01); *H01L 29/0649* (2013.01); *H01L 21/76* (2013.01); *H01L 21/762* (2013.01); *H01L 27/1211* (2013.01); *H01L 29/6681* (2013.01); *H01L 29/7846* (2013.01); *H01L 29/7851* (2013.01)

(58) Field of Classification Search
CPC ............. H01L 29/0649; H01L 29/0684; H01L 21/76229; H01L 27/0886; H01L 27/1211; H01L 21/76; H01L 21/762; H01L 21/76224; H01L 21/76283; H01L 29/6681; H01L 29/66545; H01L 29/7846; H01L 29/7851
See application file for complete search history.

(56) References Cited

U.S. PATENT DOCUMENTS

| | | | |
|---|---|---|---|
| 8,735,993 B2 | 5/2014 | Lo | |
| 2009/0273051 A1* | 11/2009 | Parekh | ................ H01L 21/2815 257/506 |
| 2014/0117454 A1 | 5/2014 | Liu | |
| 2014/0124860 A1* | 5/2014 | Cheng | .................. H01L 21/845 257/347 |

(Continued)

*Primary Examiner* — Cheung Lee
*Assistant Examiner* — Stephen C Smith
(74) *Attorney, Agent, or Firm* — Winston Hsu; Scott Margo

(57) ABSTRACT

The present invention provides a semiconductor structure, including a substrate, a shallow trench isolation (STI) disposed in the substrate, a plurality of first fin structures disposed in the substrate, where each first fin structure and the substrate have same material, and a plurality of second fin structures disposed in the STI, where each second fin structure and the STI have same material.

20 Claims, 5 Drawing Sheets

(56) References Cited

U.S. PATENT DOCUMENTS

| | | | |
|---|---|---|---|
| 2014/0124863 A1* | 5/2014 | Cheng | H01L 21/845 257/350 |
| 2015/0060960 A1* | 3/2015 | Xie | H01L 29/785 257/288 |
| 2015/0076609 A1* | 3/2015 | Xie | H01L 29/785 257/365 |
| 2015/0270158 A1* | 9/2015 | Basker | H01L 21/76224 257/401 |

* cited by examiner

SEMICONDUCTOR STRUCTURE AND MANUFACTURING METHOD THEREOF

BACKGROUND OF THE INVENTION

1. Field of the Invention

The present invention relates to a semiconductor structure and manufacturing methods thereof, and in particular, to a method for improving the reliability and yield of a semiconductor structure with fin structures.

2. Description of the Prior Art

With increasing miniaturization of semiconductor devices, various Multi-gate MOSFET devices have been developed. The Multi-gate MOSFET is advantageous for the following reasons. Manufacturing processes of Multi-gate MOSFET devices can be integrated into traditional logic device processes, and thus are more compatible. In addition, since the three-dimensional structure of the Multi-gate MOSFET increases the overlapping area between the gate and the substrate, the channel region is controlled more effectively. This reduces both the drain-induced barrier lowering (DIBL) effect and the short channel effect. Moreover, as the channel region is longer for the same gate length, the current between the source and the drain is increased.

A multi-gate MOSFET has a gate formed on fin-shaped structures, and the fin-shaped structures are formed on a substrate, wherein the fin-shaped structures formed by etching the substrate are strip structures parallel to each other. With the demands of miniaturization of semiconductor devices, the width of each fin-shaped structure narrows and the spacing between the fin-shaped structures shrinks. Thus, forming fin-shaped structures which can achieve the required demands under the restrictions of miniaturization, physical limitations and various processing parameters becomes an extreme challenge.

SUMMARY OF THE INVENTION

The present invention provides a semiconductor structure, comprising a substrate, a shallow trench isolation (STI) disposed in the substrate, a plurality of first fin structures disposed in the substrate, wherein the material of each first fin structure is the same as the material of the substrate, and a plurality of the second fin structures disposed in the STI, wherein the material of each second fin structure is the same as the material of the STI.

The present invention also provides a method for forming a semiconductor structure, at least comprising: first, a substrate is provided, and a shallow trench isolation (STI) is then formed in the substrate. Afterwards, an etching process is performed, to form a plurality of the first fin structures in the substrate and a plurality of the second fin structures in the STI simultaneously, wherein the material of each first fin structure is the same as the material of the substrate, the material of each second fin structure is the same as the material of the STI.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
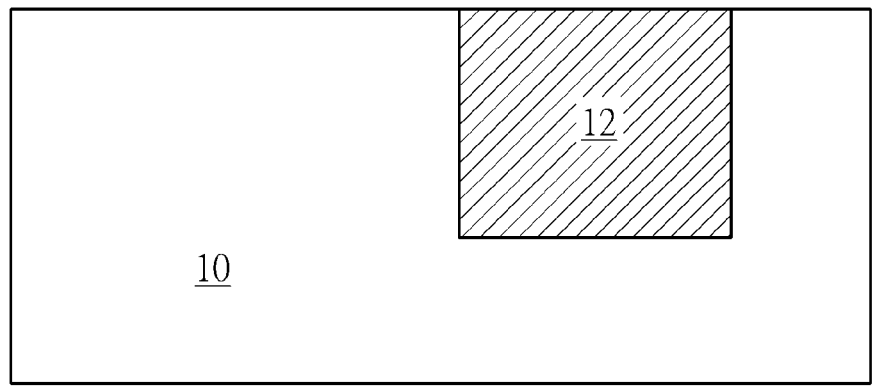
FIGS. 1-6 show the manufacturing process for forming the semiconductor structure of the first preferred embodiment of the present invention.

FIGS. 1-7 shows the manufacturing process for forming the semiconductor structure of the first preferred embodiment of the present invention. First, as shown in FIG. 1, a substrate 10 is provided, the substrate 10 may include a semiconductor substrate, such as a silicon substrate, a silicon containing substrate, a III-V group-on-silicon (such as GaN-on-silicon) substrate, a graphene-on-silicon substrate or a silicon-on-insulator (SOI) substrate. Afterwards, a shallow trench isolation (STI) 12 is formed in a partial region of the substrate 10. The material of the STI 12 may include insulating materials such as silicon oxide and silicon nitride. The method for forming the STI is well-known to those skilled in the art, the details of which are omitted herein for the sake of brevity.

Figure 2:
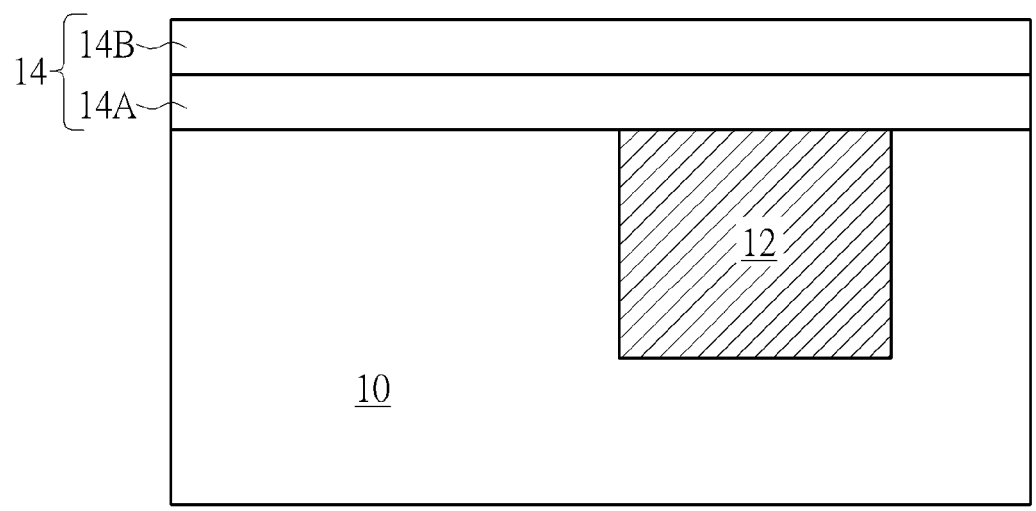
Figure 3:
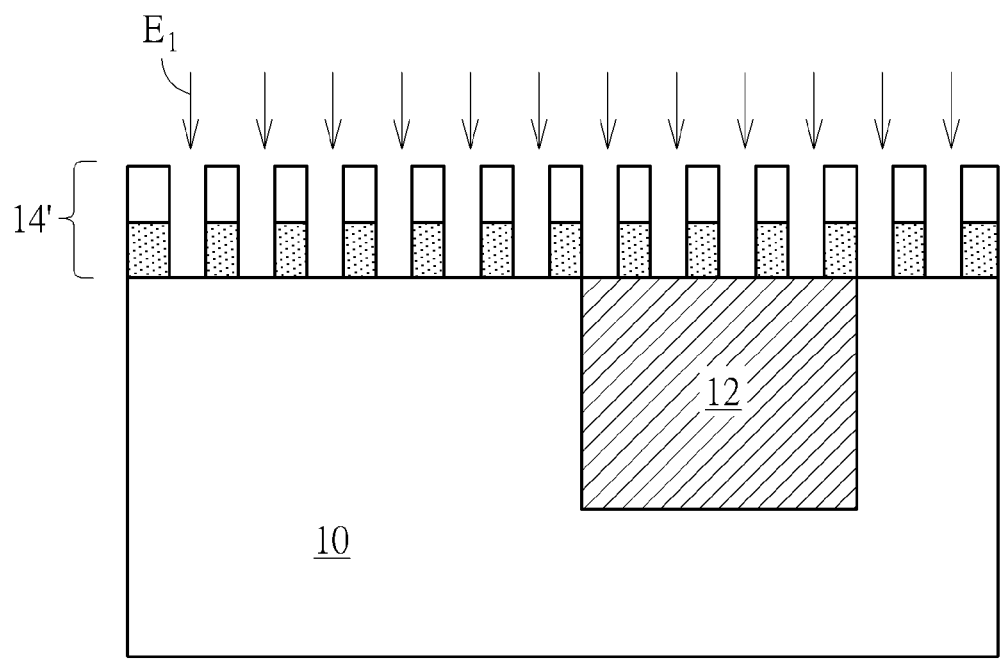

As shown in FIGS. 2-3, after the hard mask (not shown) which was formed during the process for forming the STI 12 is removed, and another hard mask 14 is then formed to cover on the substrate 10 and on the STI 12, wherein the hard mask 14 includes a single layer structure or a multiple layer structure. In this embodiment, the hard mask 14 includes a silicon oxide layer 14A and a silicon nitride layer 14B, but not limited thereto. Next, as shown in FIG. 3, an exposure and development process are performed, so as to form a patterned photoresist layer (not shown) on the hard mask 14. Afterwards, an etching process $E_1$ is carried out, to remove parts of the hard mask 14, and to form the patterned hard mask 14' on the substrate 10 and on the STI 12, and the patterned photoresist layer is then removed in the following steps. Besides, the etching process $E_1$ mentioned above not only comprises a single layer exposure and development process, it can also comprise the double patterning process or the sidewall image transferring (SIT) process, that should be within the scope of the present invention.

Figure 4:
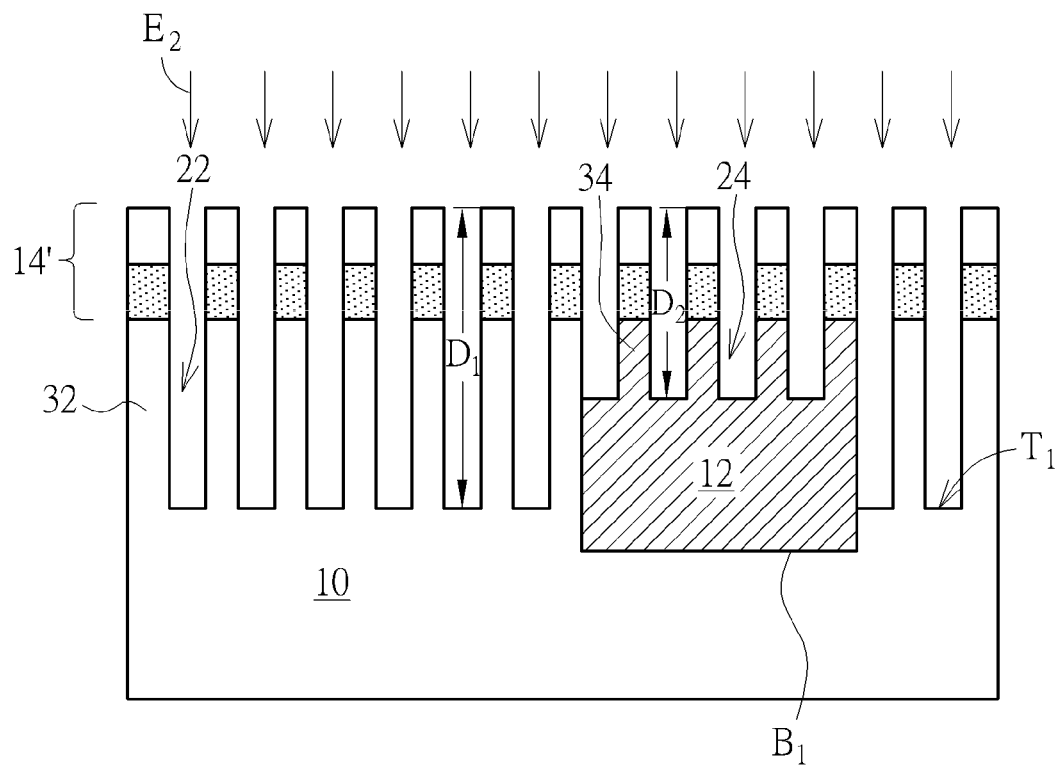

As shown in FIG. 4, another etching process $E_2$ is performed, to remove parts of the substrate 10 and parts of the STI 12. The etching process $E_2$ may comprise dry etching process and/or wet etching process, but the present invention is not limited thereto. More precisely, after the etching process $E_2$, a plurality of first trenches 22 are formed in the substrate 10, and a plurality of second trenches 24 are formed in the STI 12. At this time, within a region of the substrate 10, each projection portion between every two adjacent first trenches 22 is defined as a first fin structure 32, and within the region of the STI 12, each projection portion between every two adjacent second trenches 24 is defined as a second fin structure 34, wherein the material of the first fin structure 32 is the same as the material of the substrate 10, and the material of the second fin structure 34 is the same as the material of the STI 12. In addition, the second fin structures 34 and the STI 12 compose a monolithically formed structure. It is noteworthy that in this embodiment, the etchant used in the etching process $E_2$ has faster etching rate to the substrate 10 than the etching rate to the STI 12. Preferably, in this embodiment, the etching selectivity of the material of the substrate 10 to the material of the STI 12 is larger than 10. In this way, after the etching process $E_2$ is performed, the depth $D_2$ of each second trench 24 is shallower than the depth $D_1$ of each first trench 22. In other words, the height each first fin structure 32 (which is equal to the depth $D_1$ of each first trench 22) is higher the height of each second fin structure 34 (which is equal to the depth $D_2$ of each second trench 24). Besides, after the etching process $E_2$ is performed, a top surface $T_1$ of the substrate 10, it also being the bottom surface of each first trench 22, is preferably higher than a bottom surface $B_1$ of the STI 12.

In addition, in this embodiment, after the etching process $E_2$ is performed, the patterned hard mask 14' is still disposed on each first fin structure 32 and on each second fin structure 34, but in another embodiment, the patterned hard mask 14' may be removed completely during the etching process $E_2$, and therefore not disposed on each first fin structure 32 or on each second fin structure 34.

Figure 5:
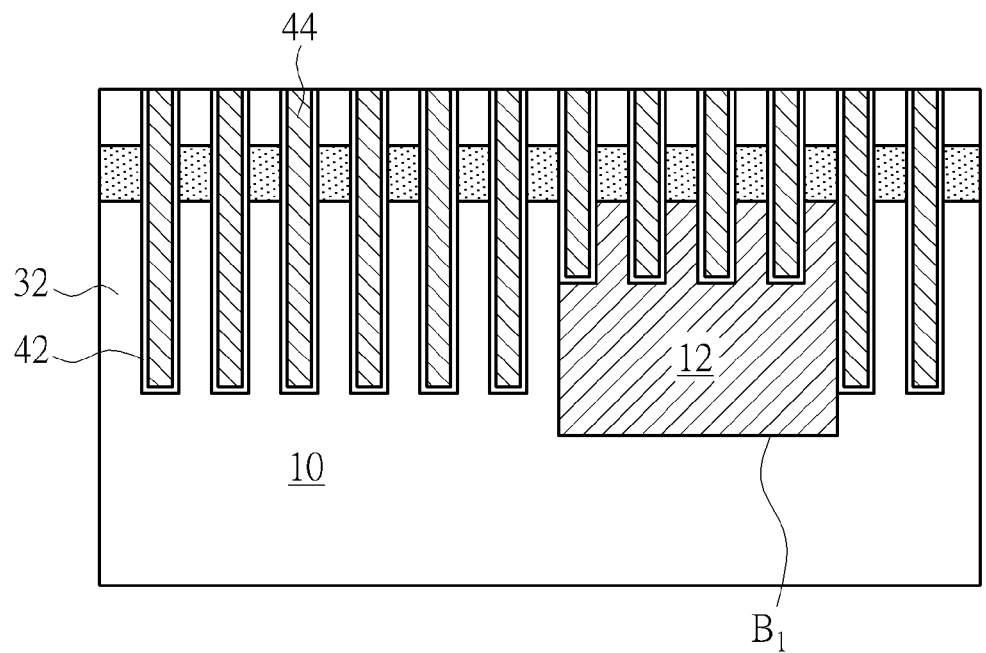

Next, as shown in FIG. 5, a liner 42 is selectively formed in each first trench 22 and in each second trench 24, the material of the liner 42 being a material such as silicon nitride, but not limited thereto. Afterwards, an insulating layer 44 is then filled in each first trench 22 and in each second trench 24, wherein the insulating layer 44 is, for example, a silicon oxide layer. In addition, a planarization process is then performed, such as a chemical mechanical polishing (CMP) process, to remove the extra insulating layer 44 on the patterned hard mask 14'. It is noteworthy that in this embodiment, the patterned hard mask 14' is removed through another etching process after the CMP is performed, but in another embodiment of the present invention, the patterned hard mask 14' may be removed while the CMP is performed.

Figure 6:
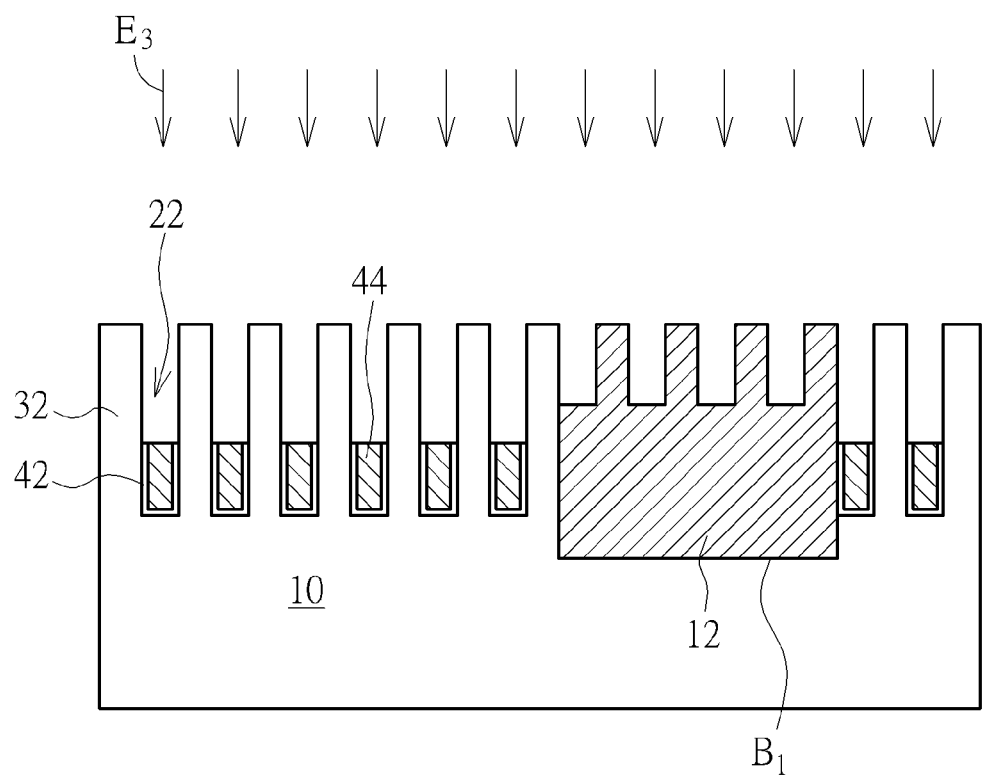
Figure 6A:
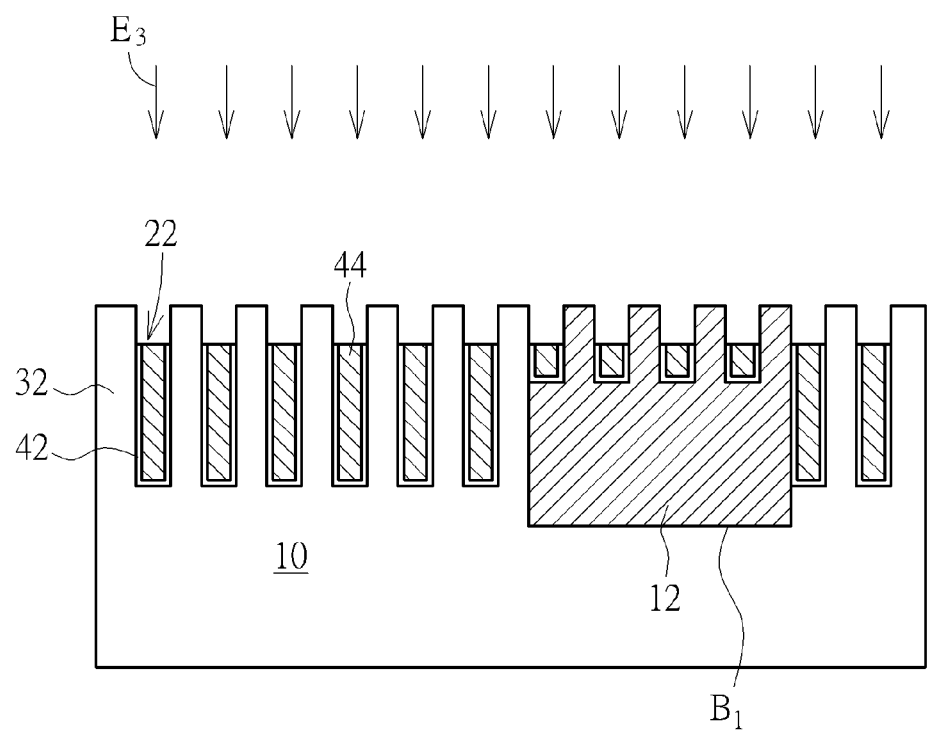
FIG. 6A shows the manufacturing process for forming the semiconductor structure of another preferred embodiment of the present invention.
Figure 7:
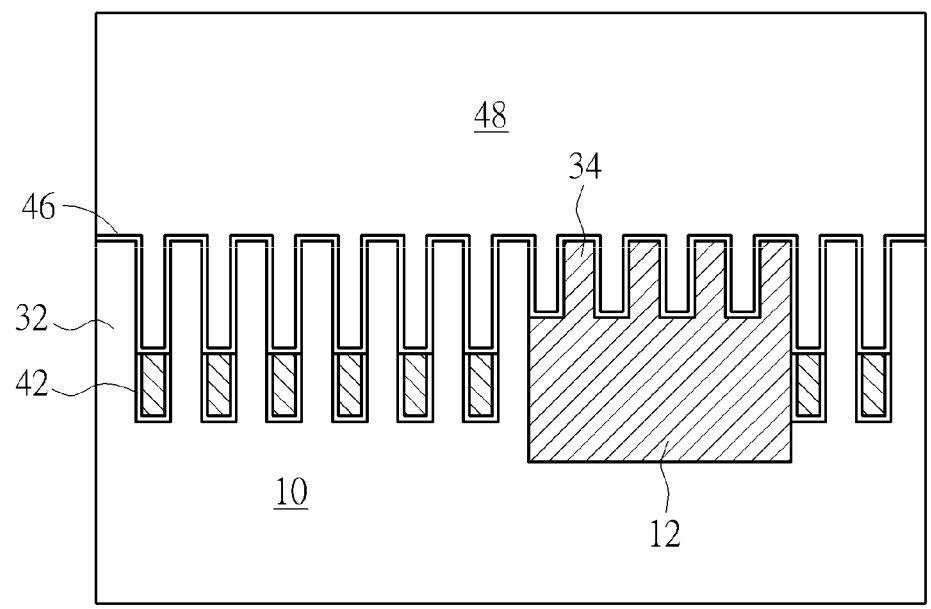
FIG. 7 shows the manufacturing process for forming the semiconductor structure of the first preferred embodiment of the present invention.

As shown in FIGS. 6-7, an etching back process $E_3$ is performed, to remove parts of the insulating layer 44 in each first trench 22 and in each second trench 24. It is noteworthy that since the depth of each second trench 24 is shallower than the depth of each first trench 22, after the etching back process $E_3$ is performed, the insulating layer 44 may be removed completely in each second trench 24 (as shown in FIG. 6), or some insulating layer 44 may still remain in each second trench 24, but the thickness of the remaining insulating layer 44 in each second trench 24 is thinner than the thickness of the remaining insulating layer 44 in each first trench 22 (as shown in FIG. 6A). In other words, if the etching time of the etching back process $E_3$ is short, the insulating layer 44 will not only exist in each first trench 22, and also exists in each second trench 24. The embodiment mentioned above should be within the scope of the present invention. But in order to simplify the description, the following descriptions are still based on the structure shown in FIG. 6.

Finally, as shown in FIG. 7, a liner 46 is selectively formed, to cover each exposed first fin structure 32, the liner 46 such as a silicon oxide layer formed through an oxidation process or a deposition process. Next, a conductive layer 48 is entirely formed, to fill in each first trench 22 and in each second trench 24, the conductive layer 48 such as a polysilicon layer, covering on the first fin structures 32 and on the second fin structures 34. In addition, the semiconductor structure of the present invention can further be applied in other related semiconductor processes, such as forming the gate structure, the source/drain or the contact plugs, and those technologies are well-known in those skilled in the art, and will not be described redundantly here.

Please refer to FIG. 7, the semiconductor structure of the present invention comprising: the substrate 10, the STI 12 disposed in the substrate 10, a plurality of the first fin structure 32 disposed in the substrate 10, wherein the material of each first fin structure 32 is the same as the material of the substrate 10, and a plurality of the second fin structures 34 disposed in the STI 12, wherein the material of each second fin structure 34 is the same as the material of the STI 12. Other details of the semiconductor structure of the present invention are described in abovementioned paragraphs, and will not be described again.

Figure 8:
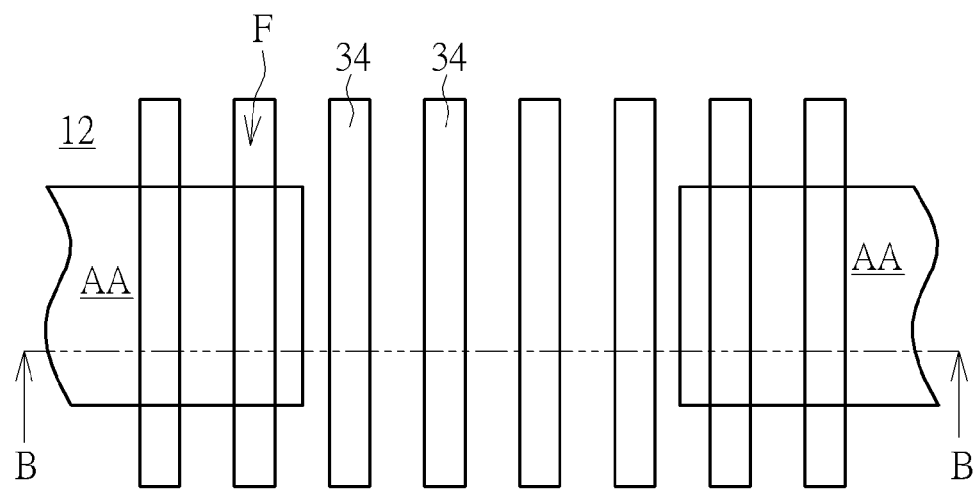
FIG. 8 is a top view diagram showing the semiconductor structure of the present invention.

Another feature of the present invention is that after the fin structure is formed, there is no need to perform a fin-cut process on the fin structure. For example, as shown in FIG. 8, FIG. 8 is a top view diagram showing the semiconductor structure of the present invention. A plurality of the active regions AA are defined on the substrate, the position of each active region AA corresponds to the substrate 10 having the first fin structure 32 disposed thereon shown in FIGS. 4-7, and the active region AA is surrounded by the STI 12. The cross section diagram along the cross section line B-B' is similar to the structure shown in FIG. 4, and not be described again.

Figure 9:
FIG. 9 shows the 3D structure of the fin structure F of FIG. 8.
Figure 9:
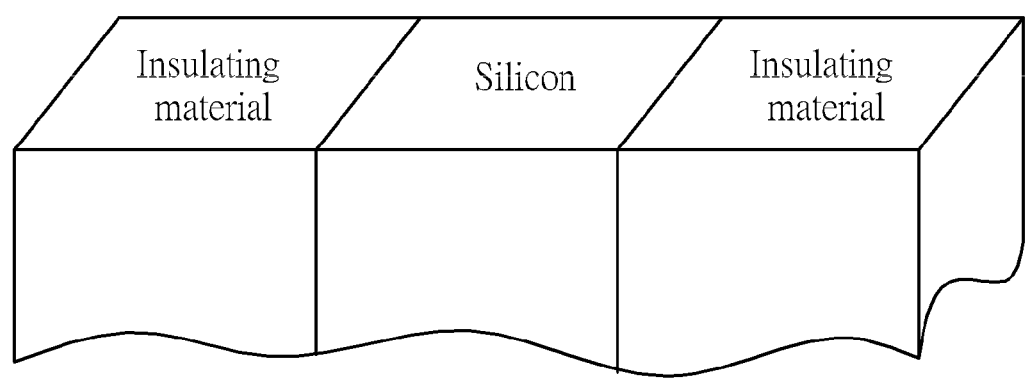

Some fin structures of the present invention may cross the active region AA and the STI 12, such as the fin structure F shown in FIG. 8. FIG. 9 shows the 3D structure of the fin structure F of FIG. 8, as shown in FIG. 9, the fin structure F has a planar top surface, and parts of the fin structure F are made of silicon (which is disposed within the active region AA), and another portion of the fin structure is made of insulating materials (which is disposed within the STI 12), wherein the portion that is made of insulating materials helps to electrically isolate the fin structure F from other elements.

In conventional process, usually the fin structures are formed on the substrate, and the fin-cut process is then performed on those fin structures. Compared with the conventional process, the present invention defines the positions of the STI firstly, and the fin structures are then formed through an etching process. The present invention has the following advantages:

(1) The second fin structure 34 is disposed on the STI 12, and it can be used as a supporting structure. For example, after the conductive layer 48 is formed, the supporting structure helps to prevent the "dishing phenomenon" from occurring.

(2) The second fin structure 34 and parts of the fin structure F are made of insulating materials, therefore, similar to the STI 12, those elements have the function to electrically isolate from other elements. In this way, the fin-cut process does not need to be performed in the following steps. Furthermore, the issue that the edge roughness after the fin-cut process can be avoided too.

(3) In conventional process, after the fin-cut process is performed, the STI 12 has a planar surface, and there is not any element disposed on the planar surface. Therefore, the fin structures which are disposed near the edge of the active region AA easily "tilt" toward the region that without any elements disposed thereon. In the present invention, since the second fin structure 34 is disposed on the STI 12, other fin structures that are disposed near the second fin structure 34 can be supported by the second fin structure 34 and do not easily tilt.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
   a substrate;
   a shallow trench isolation (STI), disposed in the substrate;
   a plurality of first fin structures, disposed in the substrate, wherein each first fin structure and the substrate comprise same material;
   a plurality of second fin structures disposed in the STI, wherein each second fin structure and the STI comprise same material; and
   a plurality of first trenches and a plurality of second trenches, each first trench is disposed between two adjacent first fin structures, each second trench is disposed between two adjacent second fin structures, each first trench has a first depth, each second trench has a second depth, and the first depth is larger than the second depth.

2. The semiconductor structure of claim 1, wherein a bottom surface of the STI is lower than a bottom surface of each first trench.

3. The semiconductor structure of claim 1, further comprising an insulating layer disposed in each first trench.

4. The semiconductor structure of claim 3, further comprising a liner disposed between the first trench and the insulating layer.

5. The semiconductor structure of claim 3, wherein the insulating layer is further disposed in each second trench.

6. The semiconductor structure of claim 5, further comprising a liner disposed between the second trench and the insulating layer.

7. The semiconductor structure of claim 1, wherein the second fin structure and the STI are a monolithically formed structure.

8. A method for forming a semiconductor structure, comprising:
   providing a substrate;
   forming a STI in the substrate; and
   performing an etching process to remove parts of the substrate and parts of the STI simultaneously, so as to form a plurality of first fin structures in the substrate, and to form a plurality of second fin structures in the STI at a same time, wherein each first fin structure and the substrate comprise same material, and each second fin structure and the STI comprise same material.

9. The method of claim 8, further comprising a plurality of first trenches and a plurality of second trenches, each first trench being disposed between two adjacent first fin structures, each second trench being disposed between two adjacent second fin structures, each first trench having a first depth, each second trench having a second depth, and the first depth being larger than the second depth.

10. The method of claim 9, wherein a bottom surface of the STI is lower than a top surface of the substrate.

11. The method of claim 9, further comprising an insulating layer disposed in each first trench and in each second trench.

12. The method of claim 11, further comprising a liner disposed between the second trench and the insulating layer.

13. The method of claim 11, further comprising performing an etching process on the insulating layer.

14. The method of claim 13, wherein after the etching process is performed, further comprising forming a dielectric layer to fill each first trench and each second trench.

15. The method of claim 8, wherein the second fin structure and the STI are a monolithically formed structure.

16. The method of claim 8, wherein before the etching process is performed, further comprising performing a patterning process to form a hard mask on the substrate and on the STI.

17. The method of claim 16, wherein the hard mask comprises a single layer structure or a multiple layer structure.

18. The method of claim 8, wherein the etching rate of the substrate is faster than the etching rate of the STI during the etching process.

19. The method of claim 18, wherein the etching selectivity of the material of the substrate to the material of the STI is larger than 10.

20. The semiconductor structure of claim 1, wherein a top surface of each first fin structure and a top surface of each second fin structure are on a same level.

* * * * *